(12) United States Patent
Johnson

(10) Patent No.: US 6,342,713 B1
(45) Date of Patent: Jan. 29, 2002

(54) METHOD OF OPERATING A MAGNETOELECTRONIC DEVICE

(76) Inventor: Mark B. Johnson, 7742 Jewelweed Ct., Springfield, VA (US) 22152

( * ) Notice: Subject to any disclaimer, the term of this patent is extended or adjusted under 35 U.S.C. 154(b) by 0 days.

(21) Appl. No.: 09/532,705

(22) Filed: Mar. 22, 2000

Related U.S. Application Data

(60) Division of application No. 08/806,028, filed on Feb. 24, 1997, now Pat. No. 6,064,083, which is a continuation-in-part of application No. 08/643,804, filed on May 6, 1996, now Pat. No. 5,654,566, which is a continuation-in-part of application No. 08/643,805, filed on May 6, 1996, now Pat. No. 5,652,445, which is a continuation-in-part of application No. 08/493,815, filed on Jun. 22, 1995, now Pat. No. 5,629,549, which is a continuation-in-part of application No. 08/425,884, filed on Apr. 21, 1995, now Pat. No. 5,565,695.

(51) Int. Cl.$^7$ .......................... H01L 29/82; H01L 43/00

(52) U.S. Cl. ................ 257/295; 257/421; 257/422; 257/426; 257/427; 438/48; 365/97; 365/145; 365/170; 365/171

(58) Field of Search ................ 257/295, 421, 257/422, 426, 427; 438/48; 365/97, 145, 170, 171

(56) References Cited

U.S. PATENT DOCUMENTS

| | | | |
|---|---|---|---|
| 4,314,349 A | 2/1982 | Batcher | 364/716 |
| 4,607,271 A | 8/1986 | Popovic et al. | 357/27 |
| 4,896,296 A | 1/1990 | Turner et al. | 365/189.08 |
| 4,905,178 A | 2/1990 | Mor et al. | 364/748 |
| 5,089,991 A | 2/1992 | Matthews | 365/9 |
| 5,237,529 A | 8/1993 | Spitzer | 365/158 |
| 5,239,504 A | 8/1993 | Brady et al. | 365/157 |
| 5,245,226 A | 9/1993 | Hood et al. | 307/465 |
| 5,245,227 A | 9/1993 | Furtek et al. | 307/465 |
| 5,251,170 A | 10/1993 | Daughton et al. | 365/158 |
| 5,289,410 A | 2/1994 | Katti et al. | 365/170 |
| 5,329,480 A | 7/1994 | Wu et al. | 365/170 |
| 5,396,455 A | 3/1995 | Brady et al. | 365/170 |

(List continued on next page.)

OTHER PUBLICATIONS

James Daughton, "Magnetoresistive Memory Technology", Thin Solid Films, vol. 216, 162 (1992).

R. Meservey, P. M. Tedrow and P. Fulde, Phys. Rev. Lett. 25, 1270 (1970).

P.M. Tedrow and R. Meservey, Phys. Rev. Lett. 26, 192 (1971).

(List continued on next page.)

*Primary Examiner*—William Mintel
(74) *Attorney, Agent, or Firm*—Law +

(57) ABSTRACT

A hybrid memory device combines a ferromagnetic layer and a Hall Effect device. The ferromagnetic layer is magnetically coupled to a portion of a Hall plate, and when such plate is appropriately biased, a Hall Effect signal can be generated whose value is directly related to the magnetization state of the ferromagnetic layer. The magnetization state of the ferromagnetic layer can be set to correspond to different values of a data item to be stored in the hybrid memory device. The magnetization state is non-volatile, and a write circuit can be coupled to the ferromagnetic layer to reset or change the magnetization state to a different value. The memory device can also be fabricated to include an associated transistor (or other suitable switch) that functions as an isolation element to reduce cross-talk and as a selector for the output of the device when such is used in a memory array. This latter arrangement also permits a bias supply to be applied to each cell in the array, increasing the output signal level and the signal to noise ratio. A high resistance element such as a resistor or diode can also be used as the isolation element depending on the particular application. In a preferred embodiment, the hybrid memory device and associated selector are combined and integrally fabricated using conventional semiconductor processing techniques to increase the integration density of memory arrays using such devices.

33 Claims, 4 Drawing Sheets

U.S. PATENT DOCUMENTS

| | | | | |
|---|---|---|---|---|
| 5,420,819 | A | | 5/1995 | Pohm ......................... 365/158 |
| 5,424,236 | A | | 6/1995 | Daughton et al. ............ 437/52 |
| 5,432,373 | A | | 7/1995 | Johnson ...................... 257/421 |
| 5,452,163 | A | | 9/1995 | Coffey et al. ............... 360/113 |
| 5,475,277 | A | | 12/1995 | Johnson ...................... 310/156 |
| 5,488,250 | A | | 1/1996 | Hennig ........................ 257/421 |
| 5,491,338 | A | | 2/1996 | Spitzer ........................ 250/307 |
| 5,565,695 | A | * | 10/1996 | Johnson ...................... 257/295 |
| 5,580,814 | A | | 12/1996 | Larson ......................... 437/52 |
| 5,594,366 | A | | 1/1997 | Khong et al. ................ 326/41 |
| 5,621,338 | A | | 4/1997 | Liu et al. ...................... 326/46 |
| 5,629,549 | A | * | 5/1997 | Johnson ...................... 257/421 |
| 5,652,445 | A | * | 7/1997 | Johnson ...................... 257/295 |
| 5,652,875 | A | | 7/1997 | Taylor ......................... 395/500 |
| 5,654,566 | A | * | 8/1997 | Johnson ...................... 257/295 |
| 6,064,083 | A | * | 5/2000 | Johnson ...................... 257/295 |

OTHER PUBLICATIONS

P.M. Tedrow and R. Meservey Phys. Rev. B 7, 318 (1973).

Mark Johnson and R. H. Silsbee, Phys. Rev. Lett. 55, 1790 (1985).

Mark Johnson and R. H. Silsbee Phys. Rev. B 35, 4959 (1987).

Mark Johnson and R. H. Silsbee, Phys. Rev. B 37, 5312 (1988).

Mark Johnson and R. H. Silsbee, Phys. Rev. B 37, 5326 (1988).

Mark Johnson, "The All Metal Spin Transistor," I.E.E.E. Spectrum Magazine, vol. 31 No. 5 p. 47 (1994).

Mark Johnson, "The Bipolar Spin Switch," Science 260, 320 (1993).

R. S. Popovi'c, "Hall–effect Devices," Sens. Actuators 17, 39 (1989).

J. De Boeck, J. Harbison et al., "Non–volatile Memory Characteristics of Submicrometer Hall Structures Fabricated in Epitaxial Ferromagnetic MnAl Films on GaAs", Electronics Letters 29, 421 (1993).

Paul Horowitz and Winfield Hill, "The Art of Electronics," Cambridge Univ. Press, Cambridge U.K. (1980); see p. 328.

* cited by examiner

METHOD OF OPERATING A MAGNETOELECTRONIC DEVICE

RELATED APPLICATIONS

The present invention is a continuation-in-part of the following prior applications by the present applicant:

(1) an application titled "Magnetic Spin Transistor, Logic Gate & Method of Operation," (Ser. No. 08/425,884, filed Apr. 21, 1995, issued May 13, 1997 as U.S. Pat. No. 5,629,549);

(2) an application titled "Magnetic Spin Transistor Hybrid Circuit Element," (Ser. No. 08/493,815, filed Jun. 22, 1995, issued Oct. 15, 1996 as U.S. Pat. No. 5,565,695);

(3) an application titled "Magnetic Spin Injected Field Effect Transistor and Method of Operation," (Ser. No. 08/643,804 filed May 6, 1996, issued Aug. 5, 1997 as U.S. Pat. No. 5,654,566);

(4) an application titled "Hybrid Hall Effect Device and Method of Operation," (Ser. No. 08/643,805, filed May 6, 1996, issued Jul. 27, 1997 as U.S. Pat. No. 5,652,445)

The present application is also a divisional application of Ser. No. 08/806,028 filed Feb. 24, 1997, now issued May 16, 2000 as U.S. Pat. No. 6,064,083.

The above materials are expressly incorporated by reference herein.

The government of the United States may have certain limited rights in the present invention.

FIELD OF THE INVENTION

The invention relates generally to magneto-electronic devices which can be used for a variety of applications, including as memory elements in a random access memory array. In particular, the present invention is directed to a hybrid Hall Effect device which includes a ferromagnetic material magnetically coupled to a conventional Hall Effect plate. The hybrid device can be coupled directly to a bias source and combined with other semiconductor structures, such as transistor isolation elements. The resulting array architectures have improved cross-talk, signal level and signal-to-noise performance characteristics.

BACKGROUND OF THE INVENTION

Hybrid Hall Effect devices are described in my earlier application (4) above. The present invention is directed to specific embodiments of such devices, as well as preferred arrangements of the same which result in improved memory elements and performance of memory arrays.

By modifying a classic Hall plate, and in particular by coupling it to a ferromagnetic material novel hybrid devices can be created that are useful for applications in high density nonvolatile memory and logic gate environments. A schematic figure that can be used to represent the novel Hybrid Hall Effect Device 10 is illustrated in FIG. 1. A standard representation for a classic four-terminal Hall plate 12 is a cross centered in a square. Two opposing terminals are used for current bias (or voltage bias), for example terminals 14 and 16, and the other two terminals 18 and 20 are used for sensing a bipolar Hall voltage.

One embodiment of the hybrid Hall Effect device described in my earlier application (4) incorporates a ferromagnetic film F 22 fabricated to be electrically isolated from the Hall plate but covering a portion of the area of the Hall plate such that an edge 26 of the film is over a central region of the plate. Local, fringe magnetic fields from the edge of the ferromagnetic film are perpendicular to the plane of the plate, may point "up" or "down" depending on the orientation of the magnetization in F, and have an average value $B_{av}$ in the active region of the device. For constant bias current the sensed Hall voltage has opposite polarity when the fringe fields are "up" compared with when they are "down." The magnetization ^M24 of F is typically in the plane of F and lies along an axis parallel with that of the bias current. Other orientations can be used however, such as magnetizations that are perpendicular to the plane instead. The magnetization can be configured to have two stable states along this axis, with the two states corresponding to "up" or "down" fringe fields near the edge of F, positive or negative Hall voltage, and thus representing a binary bit of information "1" or "0". The magnetization state can be set (written) to be positive or negative by using the magnetic field associated with a positive or negative current pulse transmitted down an integrated write wire that is contiguous with F, discussed in detail in application (4) above, as well as below. It follows that such a device can be used as the nonvolatile storage element in an array of elements comprising a nonvolatile random access memory (NRM). FIG. 1 depicts the first embodiment of the Hybrid Hall Effect device, generally referred to hereafter as a "modified hall plate." Again, while application (4) describes one preferred physical embodiment of the modified hall plate, it will be understood by those killed in the art that a variety of layer materials, layer structures and layer arrangements are possible.

My earlier application (4) described various arrangements of the type of hybrid Hall Effect devices described above which could be used as a memory array. In particular, a linear row of elements can be constructed with such devices, so that the positive current bias termi of one element (e.g. terminal 14 in FIG. 1) is connected in series with the negative current bias terminal of another (e.g. terminal 16). In this way, a number $n_i$ of elements is combined in one row and biased by a single current (or voltage) supply source, $I_B$ or $V_B$. Each element of that row can then be sensed by a unique sense amplifier devoted to that element. Alternatively, a single amplifier can be used for all elements in the row if a selection and isolation device is used to isolate each element from all of the other elements. A field effect transistor (FET) used in this manner can be referred to as a "select transistor."

While the above memory array arrangement is satisfactory for many environments, other applications may experience undesirable problems when a number $n_j$ of rows are fabricated together to form an array of this type. In particular, because the hybrid Hall Effect memory cells are not isolated from each other, Hall voltages generated at one cell can dissipate through common connections to neighbor cells and the signal level, as well as the signal to noise ratio (SNR) of the readout voltage for every cell can be degraded. There is a need, therefore, for hybrid Hall Effect memory cell embodiments and arrangements which eliminate and/or reduce such performance problems.

SUMMARY OF THE INVENTION

An object of the present invention therefore is to provide an improved architecture for a hybrid Hall Effect device to be used as a memory cell in a memory array.

A further object of the present invention is to provide an improved architecture for a random access memory array of hybrid Hall Effect memory cells which permits a bias voltage (or current) to be provided to each such cell, thus resulting in improved signal level and signal-to-noise ratio characteristics for such array.

Another object of the present invention is to provide an improved memory cell for application in a memory array environment, which affords improved cell isolation and reduced cross talk between cells in the array.

According to the present invention, an array of modified Hall Effect plate memory elements with improved performance is formed by providing the bias source IB or (VB) directly to each cell in the array to increase the SNR. The outputs of the Hall Effect plate memory elements can be coupled to a select transistor which acts as an isolation element to reduce cross-talk between cells in the array. In this way, the magnetization state of the ferromagnetic layer and the output of the Hall Effect plate for each hybrid memory cell is retained and isolated from other hybrid memory cells.

The bias source and ground for the cells are provided by additional individual levels of lithography, and this choice increases the number of fabrication steps (and levels) by comparison with the simpler array described earlier. However, the hybrid Hall Effect device requires far fewer levels than conventional dynamic random access memories (DRAM) and this economy of fabrication is only marginally diminished by the addition of a few levels.

In the preferred cell architecture, one selection transistor is fabricated within each cell. When a select transistor for a particular cell is addressed the Hall voltage developed by that cell is the only voltage transmitted to the input line of a sense amplifier that is common to a column of cells. The signal to noise ratio (SNR) can be adjusted to any desired value and there is minimal (or zero) signal leakage between neighboring cells.

Thus, the preferred cell architecture is comprised of a single modified hall plate and an accompanying single select FET that can be fabricated with a small cell area and a high packing density. Furthermore, in another embodiment of the invention, if readout voltages are sufficiently large as to accommodate some dissipation as the voltage is transmitted across the FET, then select transistors with relatively poor operating parameters, or other high impedance elements such as resistors or diodes can be used. Such transistors and high impedance elements can be made by thin film processing, and this would permit the fabrication of multiple layers of cells, further increasing density.

Data can be written to and stored in the hybrid Hall Effect memory element by transmitting a suitable current pulse to alter the magnetization state of the ferromagnetic layer. In addition, write circuitry can be included in a memory array of the present invention if it is desirable that the data (magnetization state) be modifiable at a later time. The stored data is non-volatile and will not be affected by loss of power to the memory cell array.

DETAILED DESCRIPTION OF THE INVENTION

The hybrid Hall Effect device of the present invention consists basically of a ferromagnetic material coupled magnetically to a conventional Hall Effect plate. It should be noted that the term "Hall Effect plate" is a typical term in the art and as used herein is intended in its broadest sense to include any device or structure that can be used to generate a Hall effect signal. For example, as noted above, Hall Effect plates typically include a single layer of semiconductor material and four associated terminals of some kind. It will be understood by those skilled in the art, however, that a variety of structures, materials and arrangements may be employed to create a device or structure that can generate a Hall Effect. For example, the conductive layer and terminals of the plate can be fabricated in a semiconductor material using a variety of conventional processing techniques. The teachings of the previous and present invention can be applied generally, therefore, to any such Hall Effect devices or structures irrespective of their form.

Figure 1:
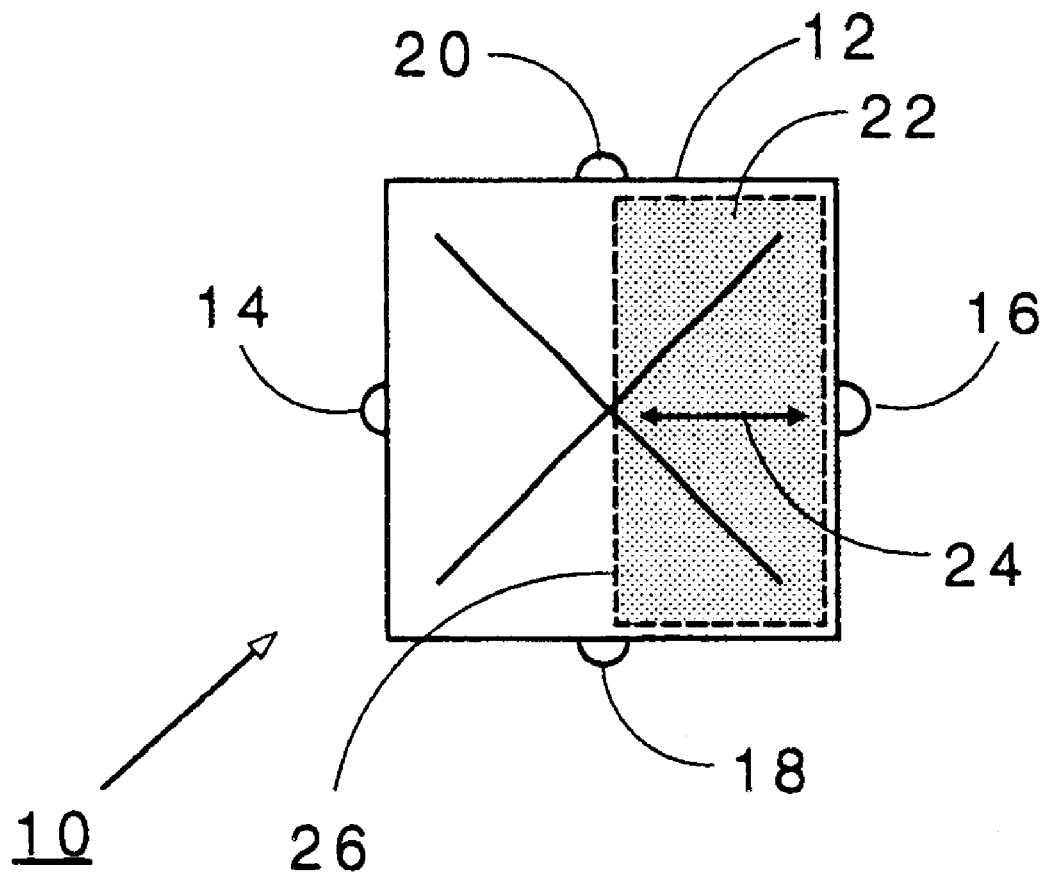
FIG. 1 is a schematic representation of a typical hybrid Hall Effect device of the present invention.

Accordingly, in the present invention as seen in FIG. 1, Hall Effect plate 12 includes a conductive layer that is capable of carrying a current when a bias voltage is applied to terminals 14 and 16. When the ferromagnetic material 22 is set to a particular magnetization state, this state is magnetically coupled to a portion of conductive layer 12, and results in a hall effect voltage between terminals 18 and 20. In a preferred embodiment, ferromagnetic film 22 overlies approximately ½ of the area of plate 12, and a magnetic field emanating from an edge portion of such film is located and coupled substantially perpendicular to an axis extending from terminals 18 and 20. If terminal 18 is set to a ground reference, it can be seen that a signal is output at terminal 20 by the Hall Effect plate that is representative of the magnetization state of the ferromagnetic material. This magnetization state can have different values corresponding to different values for a data item to be stored in the memory element.

Figure 4:
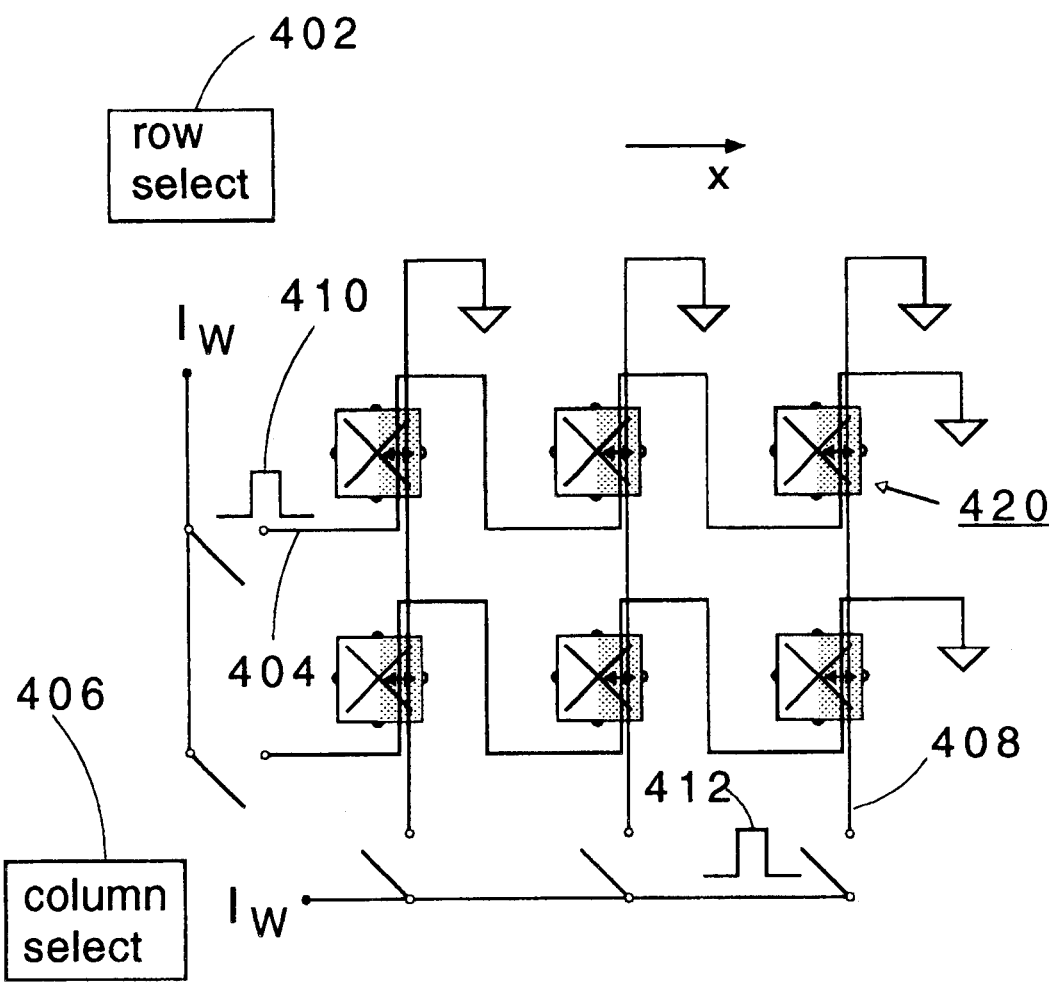
FIG. 4 illustrates a typical write circuit that may be employed in the present invention for writing data to the hybrid Hall Effect memory cells.

In one embodiment of the present invention the magnetization state of the ferromagnetic material is configurable and can be set and reset with an accompanying write circuit shown generally in FIG. 4. There may be memory applications, however, where it is only necessary to set the magnetization state once to store a particular data value, such as in a ROM, and in such cases, a write circuit is not necessary. It can be further observed that once the magnetization state of the ferromagnetic material 22 is set, it is non-volatile and thus stores the value for such data item permanently at such memory location until such time as it is desired to retrieve and read such item.

Figure 2:
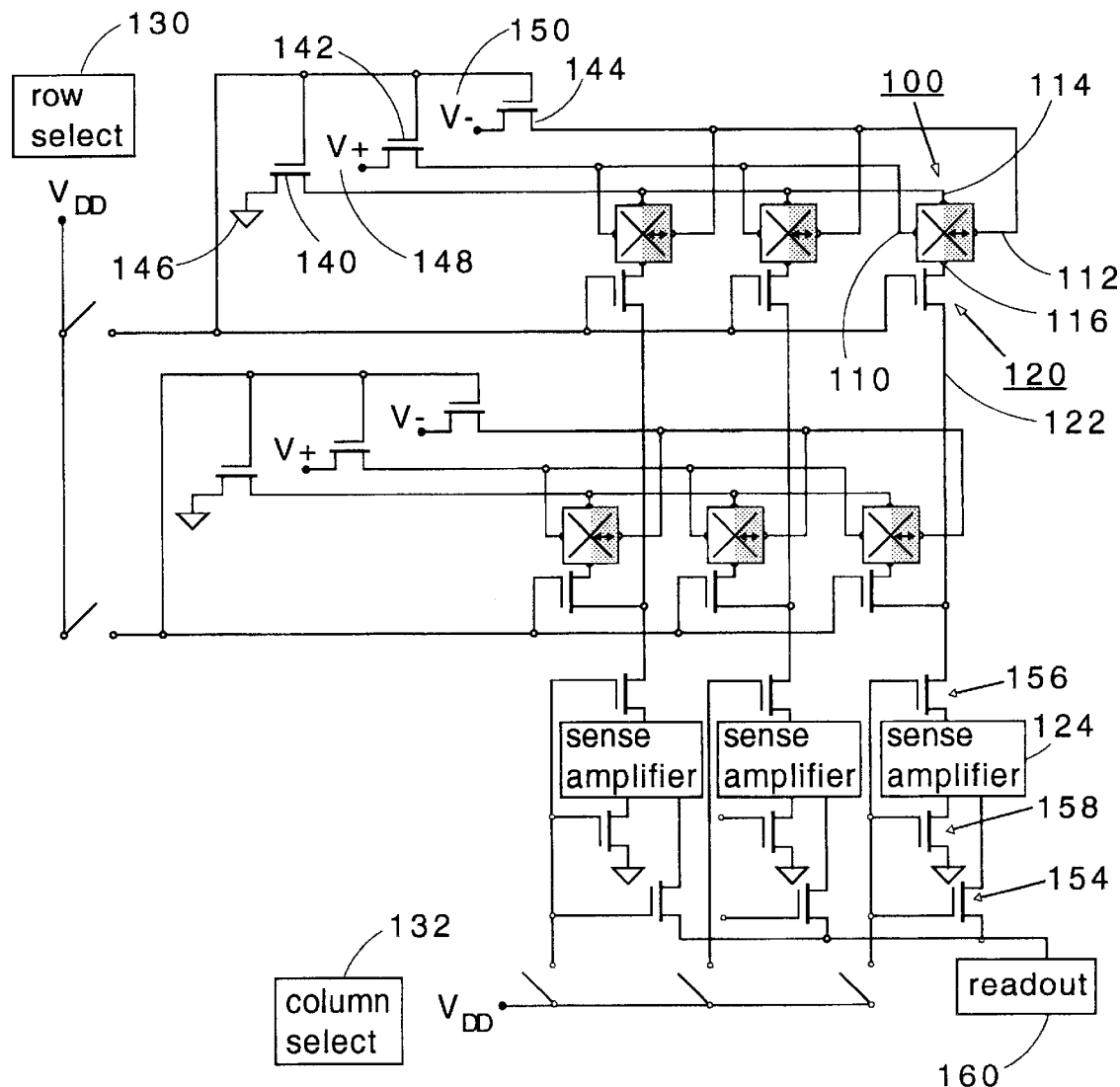
FIG. 2 depicts one embodiment of the present invention consisting of an array of hybrid Hall Effect memory cells optimized for high SNR and minimal cross-talk.

An improved array of hybrid Hall Effect devices that can be used as memory cells in an NRAM is depicted schematically in FIG. 2 and permits an analysis of the process by which data can be read from such cells. For simplicity of discussion a 3×2 array is presented but those skilled in the art will appreciate that the principles for an array of arbitrary size n rows×m columns are exactly the same. A bias voltage is supplied directly to each cell. In memory cell 100, for example, the bias voltage is applied across terminals 110 and 112. It is understood by those skilled in the art that the supply voltage may be bipolar (V+ to V− as drawn) or may have a single polarity and a ground. The reference ground for sensing the Hall voltage generated by the memory cell is attached to a third terminal in each cell, e.g. terminal 114 in cell 100. Again, it is understood by those skilled in the art that the reference ground may be, in some applications, electrically equivalent with the bias voltage ground.

The fourth terminal of each memory cell, e.g. terminal 116, provides the Hall voltage as a readout signal of magnitude Vr. Again, it will be understood by those skilled in the art that this hall signal output "terminal" 116 (as with the other terminals 110, 112 and 114 of the Hall Effect device) may take on a variety of forms, and be fabricated and coupled to the modified Hall plate in a variety of ways using conventional semiconductor processing techniques.

The output signal of terminal 116 is connected to one terminal of a select transistor 120, which, in a preferred embodiment, is fabricated as part of memory cell 100 using conventional semiconductor processing techniques to increase the packing density of the array. It is further well known in the art that the output signal (readout voltage) from the Hall Effect device in memory cell 100 may be bipolar or, if a suitable geometric offset is lithographically employed during fabrication, such readout may have two values such as zero and positive or zero and negative. The other terminal of select transistor 120 is connected by line 122 to the input of a sense amplifier 124. In the array of FIG. 2, select transistor 120 (and all transistors that perform a selection (or address) function) are depicted as n-channel enhancement mode FETs. When an adequate voltage is applied to the gate of such a device the channel between source and drain has high conductance and acts as a short circuit. With zero voltage applied to the gate the channel has high impedance and the source and drain terminals are electrically isolated by an open circuit. It is understood to those skilled in the art, that a variety of transistor devices or similar switching devices could be used to accomplish this same function depending on the requirements of the particular application.

The array is provided with conventional row select 130 and column select 132 logic such that any individual cell (ij) can be uniquely addressed, and the data read out from the hybrid Hall Effect memory cell. For example, to address cell 100 shown in the first row of the array, the gates of all select FETs in such row are raised to a level $V_{DD}$ high enough to activate the FETs. When row select transistor 140 is thus activated, a reference ground for terminal 114 (and for all cells in the first row) is connected to a global reference ground 146. Similarly, when row select transistor 142 is activated, terminal 110 of cell 100 (and all such terminals for all cells in the first row) receives a positive bias through the connection to a common positive voltage supply 148 V+. When row select transistor 144 is activated, the negative bias terminal 112 for cell 100 (and for all cells in the first row) is connected to a common negative voltage supply 150 V−.

In some memory applications where high speed access of the data is more desirable than low power, it may be desirable to maintain (or fix) the bias voltage across terminals 110 and 112 at all times, or to pre-connect the bias voltage prior to reading the cell using well-known techniques in the art. In such embodiments where a bias is already applied to cell 100, the state of the memory cell is represented by two separate measurable quantities, including both the magnetization state of the ferromagnetic material and the associated generated Hall Effect signal at terminal 116. The electrical signal representing the value of the data stored in the memory cell in these embodiments is present and can be sensed immediately, thus increasing the speed of operation of memory arrays constructed in this fashion.

Next, a row selection signal is applied to select transistor 120 of cell 100 (and to each select transistor for the cells in the first row). This signal activates select transistor 120 and a Hall voltage generated by the modified Hall plate of each cell is transmitted to the sense amplifier for the column which includes that particular cell. For cell 100 therefore select transistor 120 is activated and the readout voltage is transmitted to sense amplifier 124. Sense amplifier is a conventional circuit, and typically amplifies the readout voltage $V_r$ to a level appropriate for related logical circuitry (CMOS or TTL). The address and readout process is completed by choosing a particular column. To read out the contents of cell 100, gate voltages of select transistors at the third column of the array are raised to a level $V_{DD}$ adequate to activate the FETs. Activating output FET 154, for example, transmits the amplified readout voltage to a readout terminal 160 at an appropriate CMOS or TTL level such that it can be incorporated into other logical or processing operations. This is but one example of a typical sense amplifier and read out circuit that could be used with the present invention. A number of well-known address logic, sense amplifier and readout circuits can be used with the present invention depending on the requirements of a given application.

It is clear from this example that an array of this kind permits a high degree of cell isolation and a high value of SNR The supply voltage, bias ground and reference ground of each cell in a row are fixed to common values during readout, and are isolated from all other rows. The output readout voltage $V_r$ output of each cell is the only floating voltage in the cell and $V_r$ is isolated from other cells in the row. Furthermore, it is isolated from other cells in its column by the select transistor 120, which acts as an isolation element. Thus, there is no "cross-talk" between cells.

Figure 3:
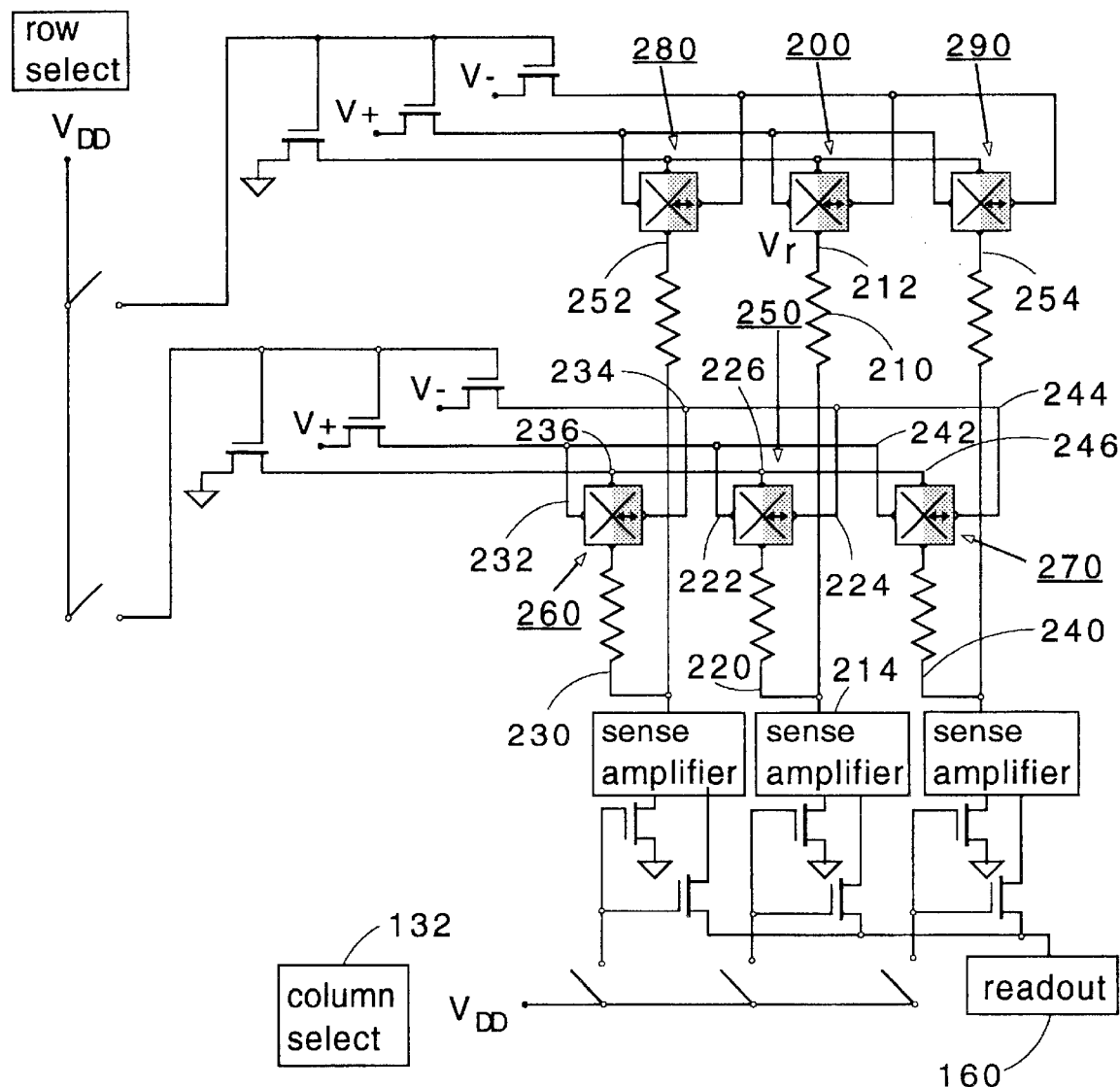
FIG. 3 depicts another embodiment of the present invention consisting of an array of hybrid Hall Effect memory cells that has a higher packing density than that of FIG. 2 but which has lower SNR

Whereas the cell utilized in the array of FIG. 2 requires a single select transistor and is comprised of only two elements, thereby permitting fabrication with a minimal area and promoting high packing density, there may be applications wherein a further reduction of cell area is desired. The select transistor within each cell can be eliminated with some degradation of performance. The array depicted in FIG. 3 is able to minimize the "cross-talk" between neighboring cells even when there is no select transistor for such cell. In most ways the array of FIG. 3 is identical with the array of FIG. 2, but the fourth terminal of each cell, e.g. terminal 212 in cell 200 outputs a Hall voltage as a readout signal of magnitude V, and is connected through a high impedance element (such as a thin film resistor or diode) to a sense amplifier 214 used by all cells of that column.

The address and readout operations for this embodiment proceed in a manner similar to the discussion above. In contrast with the almost complete isolation afforded by the array of FIG. 2, a fraction of the voltage $V_r$ of cell 200 is transmitted by terminal 220 to cell 250 and then by terminals 222, 232, 224, 234, 226 and 236 to cell 260 and by terminals 222, 242, 224, 244, 226, and 246 to cell 270, and finally by terminals 230 and 252 to cell 280 and by terminals 240 and 254 to cell 290. In this way the Hall voltage generated in each cell interferes somewhat with that of its neighboring cells; the readout voltage amplitude $V_r$ transmitted to the sense amplifier and the SNR are both diminished. However, in some environments this degradation of performance can be tolerated.

It will be clear to those skilled in the art that a variety of passive high impedance elements, or combination of elements may be employed. For example, in an environment where cells in the array are addressed by pulses of short duration, there are advantages to using a capacitor as the high impedance element 210. Even if the capacitive coupling is small, a bias current in the form of a narrow pulse formed with high frequency components will generate a similarly narrow output voltage pulse that will be capacitively coupled to the input line of the sense amplifier. However, low frequency components that may contribute noise will be poorly coupled to the amplifier input line, and poorly coupled to the rest of the array. An analysis similar to that presented above hows some degradation of performance, but again, in some environments this can be tolerated. Indeed, in some environments it may be possible to bias the cells of each row in series (as described in my prior application (4) above) and capacitively couple the readout pulse to a sense amplifier that is common to a column of cells. In such an application, all cells in a row are read out at one time. This is a common technique used in conventional contemporary flash memory cell architectures, and it will be apparent again to those skilled in the art that the present hybrid cell could be used equally well in such architectures.

Write operations for the memory cells are typically performed with a write circuit consisting of an array of write wires coupled to the ferromagnetic layers of the hybrid Hall Effect devices. In some applications, it may be desirable to incorporate some of the wires from the read circuit into the write wire array. In other applications, as noted earlier, the use of write wires may be unnecessary if the data to be stored does not have to be changed.

These types of write wires are well-known in the art, and again, a variety of structures and coupling techniques may be employed to affect the writing of the data to be stored as magnetization states in the memory cells. For example, the write wires can be made of thin film layers using conventional processing methods. A detailed explanation of the structure and operation of such write wires is unnecessary for consideration of the present invention, but may be found in the application described above as "Magnetic Spin Transistor, Logic Gate & Method of Operation." The write process is the same as that described therein, and the concept is briefly reviewed in FIG. 4.

Each write wire of a particular row or a column, is inductively coupled to the ferromagnetic film of each element in the same respective row or column. The inductive coupling constant $\alpha$ is defined such that the amplitude $I_w$ of a current pulse in the write wire is proportional to the magnetic field $H_w$ produced by the current pulse at the position of the ferromagnetic film F, $I_w \alpha = H_w$. When the magnitude $H_w$ is slightly larger than the coercivity $H_c$ of F, a positive or negative current (and field) pulse is sufficient to orient the magnetization vector M of F to be positive or negative along the chosen axis. The current is normalized and the write wires are fabricated with a designed to have an appropriate value such that a unit current pulse, $I_w=1$, produces a field $H_w > H_c$, where $H_c$ is the coercivity of F. When activated, the write wires in each row and column are given amplitude ½ so that the field produced by two write wires at a single element is adequate to orient the magnetization vector M of the ferromagnetic film, but the field produced by a single write wire at any other element is not sufficient to alter the magnetization state of the ferromagnetic film of that element.

For example, a 1 bit value for a data item bit is written to cell 420 of FIG. 4 in the following way. Row select logic 402 activates write wire 404 for row 1, and column select logic 406 activates write wire 408 for column 3. A variety of conventions for binary storage may be chosen, and for the example depicted in FIG. 4 the choice with magnetization along −x will correspond to the binary "1" and magnetization along +x to "0." Positive current pulses 410 and 412 of amplitude ½ are simultaneously transmitted down write wires 404 and 408. The magnetic field associated with the current pulses at the position of the ferromagnetic film of cell 420 has magnitude $H_w > H_c$ and direction −x, and the magnetization vector M of cell 420 becomes oriented along −x [for write wires fabricated on top of F], representing a "1." The magnetic field associated with the current pulses at the position of the ferromagnetic film of any other cell has magnitude $H_w/2 < H_c$, and none of the magnetization states of the ferromagnetic films of the other cells is affected. In a similar analysis, transmitting negative current pulses of amplitude ½ simultaneously down write wires 404 and 408 causes the magnetization of the ferromagnetic film of cell (1,3) 420 to orient along +x, representing a "0."

While the present invention has been described in terms of a preferred embodiment, it is apparent that skilled artisans could make many alterations and modifications to such embodiments without departing from the teachings of the present invention. Accordingly, it is intended that all such alterations and modifications be included within the scope and spirit of the invention as defined by the following claims.

What is claimed is:

1. A method of storing data in a memory element, said element including a ferromagnetic material and a hall effect plate carrying a bias current, the method comprising the steps of:
   setting the ferromagnetic material to a magnetization state corresponding to the data;
   magnetically coupling the ferromagnetic material to a substantial cross section portion of the bias current carried in the hall effect plate;
   isolating an output of the hall effect plate with an isolation element so that the data of such memory element is isolated.

2. The method of claim 1, further including the steps of applying a bias to the hall effect plate, and generating an electrical signal at the output of such plate related to the magnetization state and said data.

3. The method of claim 2, further including the step of activating the isolation element so as to transmit the output electrical signal to a sensing circuit.

4. The method of claim 3, further including a step wherein the sensing circuit determines a value of the data based on the output electrical signal.

5. The method of claim 1, wherein the magnetization state corresponding to said data is configurable and is set by a write circuit.

6. The method of claim 1, wherein the magnetization state is non-volatile.

7. A method of storing a data item in a memory element, said memory element including a first conductive material, and a second ferromagnetic material, said method comprising the steps of:
   setting a magnetization state of the second ferromagnetic material to correspond to the data item; and
   generating an electrical current in a first path in the first conductive material;
   generating an output electrical signal from the first conductive material by magnetically coupling a substantial cross section portion of said electrical current in said first path with said magnetization state;
   wherein the output electrical signal in the first material is related to said data; and
   isolating the output electrical signal with an isolation element coupled to the first material.

8. The method of claim 7, further including a step of activating the isolation element so as to transmit the output electrical signal to a sensing circuit.

9. The method of claim 8, further including a step wherein the sensing circuit determines a value of the data based on the output electrical signal.

10. The method of claim 7, wherein the magnetization state corresponding to said data is set by a write circuit.

11. The method of claim 7, wherein the magnetization state is non-volatile, and configurable by a write circuit.

12. A method of storing data in an array of memory elements, each of said elements including a ferromagnetic material and a hall effect plate, comprising:

setting the ferromagnetic material of such memory elements to a magnetization state corresponding to said data;

magnetically coupling the ferromagnetic material of each memory element to a respective portion of the hall effect plate of such memory element, which portion represents a substantial cross section of the hall effect plate;

isolating outputs of the hall effect plates of such memory elements with isolation elements.

13. The method of claim 12, further including the steps of applying a bias to the hall effect plate of one or more of the memory elements, and generating electrical signals at the outputs of such plates related to the magnetization state and data stored in such elements.

14. The method of claim 13, further including the step of activating one or more of the isolation element so as to transmit the output electrical signals to a sensing circuit.

15. The method of claim 14, further including a step wherein the sensing circuit determines a value of the data based on the output electrical signal.

16. The method of claim 15, wherein the magnetization state corresponding to said data is configurable and is set by a write circuit.

17. The method of claim 12, wherein the magnetization state is non-volatile.

18. A method of operating a magnetoelectronic memory array for storing a plurality of data values comprising the steps of:

providing a plurality of interconnected magnetoelectronic elements, such that each of said plurality of interconnected magnetoelectronic elements includes a ferromagnetic layer with a magnetization state representing a stored data value; and providing a data output terminal for each of said plurality of interconnected magnetoelectronic elements, which data output terminal provides an output signal based on said magnetization state for each of said plurality of interconnected magnetoelectronic elements;

providing an isolation element for each of said plurality of interconnected magnetoelectronic elements for isolating each of said plurality of magnetoelectronic elements from each other; and selectively activating said data output terminal for one of said plurality of interconnected magnetoelectronic elements with a select signal to determine the data value in such magnetoelectronic element.

19. The method of claim 18, further including a step of providing a corresponding hall effect device for each of said plurality of magnetoelectronic elements, and coupling said magnetization state in each of said plurality of magnetoelectronic elements to an electrical current carried in said corresponding hall effect device.

20. The method of claim 18, wherein said isolation element is a FET that isolates said data output terminal.

21. The method of claim 18, wherein said FET is also controlled by said select signal so that said output signal can be transmitted to a data sensing circuit.

22. The method of claim 18, wherein said isolation element is a diode or resistor that isolates said data output unless said select signal is applied to the memory circuit.

23. The method of claim 18, further including a step of receiving the output signal and determining the data value using a sensing circuit.

24. The method of claim 18, wherein the data value is configurable and non-volatile.

25. The method of claim 19, further including a step of maintaining a bias signal to said hall effect device so that said electrical current is generated at all times said memory circuit is operated.

26. The method of claim 18, further including a step of writing the data value, said writing step using a row write wire carrying a row signal, and a column write wire carrying a column signal, and being carried out such that said magnetization state for any of said plurality of magnetoelectronic elements is adjustable only when both said row and column signals combine to generate a sufficiently large write magnetic field to alter said magnetization state.

27. A method of operating a magnetoelectronic memory array for storing data values comprising the steps of:

arranging a plurality of magnetoelectronic elements in an array including at least one row and one column, each of said plurality of magnetoelectronic elements having a ferromagnetic layer with a magnetization state corresponding to one of the data values, such that a plurality of data values are stored as a plurality of magnetization states of a plurality of ferromagnetic layers; and inductively coupling a first write line to ferromagnetic layers of magnetoelectronic elements lying in said at least one row; and inductively coupling a second write line to ferromagnetic layers of magnetoelectronic elements lying in said at least one column; and placing said first and second write lines with respect to said plurality of ferromagnetic layers such that the presence of a write signal on only one of said first and/or second write lines generates a magnetic field that is insufficient to alter said magnetization state for any of said plurality of magnetoelectronic elements.

28. The method of claim 27, wherein said write signal is configured so that when present on said first or second write lines it generates a magnetic field having a coercivity that is greater than ½ of that of said ferromagnetic layer.

29. The method of claim 27, wherein a first write signal on said first write line and a second write signal on said second write line are required at the same time to alter said magnetization state.

30. The method of claim 27, wherein at least one of said first or second write lines is also used as a read line.

31. A method of storing data values in a magnetoelectronic memory array comprising the steps of:

arranging a plurality of magnetoelectronic elements in an array including at least one row and one column, each of said plurality of magnetoelectronic elements having a ferromagnetic layer with a magnetization state corresponding to one of the data values, such that a plurality of data values are stored as a plurality of magnetization states of a plurality of ferromagnetic layers; and inductively coupling a first write line to ferromagnetic layers of magnetoelectronic elements lying in said at least one row; and inductively coupling a second write line to ferromagnetic layers of magnetoelectronic elements lying in said at least one column; and arranging said first and second write lines with respect to said plurality of ferromagnetic layers such a data value for a magnetoelectronic element located at an intersection of said first and second write lines is alterable only in response a first write signal and a second write signal being present on said first and second write lines respectively at the same time.

32. The method of claim 31, wherein said first write signal and said second write signal each generate a magnetic field having a coercivity that is greater than ½ of that of said ferromagnetic layer.

33. The method of claim 31, wherein at least one of said first or second write lines is also used as a read line.

* * * * *